(12) United States Patent
Vanka et al.

(10) Patent No.: US 12,154,843 B1
(45) Date of Patent: *Nov. 26, 2024

(54) PROCESSORS AND INTEGRATED CIRCUITS INCLUDING A MICROELECTROMECHANICAL SYSTEMS (MEMS) DEVICE FOR COOLING

(71) Applicant: HONEYWELL INTERNATIONAL INC., Charlotte, NC (US)

(72) Inventors: Sridhar Vanka, Bangalore (IN); Prashant Deshpande, Bangalore (IN); Deepak Kumar, Bangalore (IN); Pranita Madke, Bangalore (IN); Ritu Rai, Bangalore (IN); Prashantha Sv, Bangalore (IN)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/440,221

(22) Filed: Feb. 13, 2024

Related U.S. Application Data

(63) Continuation-in-part of application No. 18/457,562, filed on Aug. 29, 2023, now Pat. No. 11,965,644.

(51) Int. Cl.
| | |
|---|---|
| *H01L 23/467* | (2006.01) |
| *B81B 3/00* | (2006.01) |
| *F21V 5/00* | (2018.01) |
| *F21V 29/508* | (2015.01) |
| *F21V 29/60* | (2015.01) |
| *F21W 107/30* | (2018.01) |
| *F21Y 113/00* | (2016.01) |
| *F21Y 115/10* | (2016.01) |

(52) U.S. Cl.
CPC ......... *H01L 23/467* (2013.01); *B81B 3/0021* (2013.01); *F21V 29/508* (2015.01); *F21V 29/60* (2015.01); *B81B 2201/036* (2013.01); *F21V 5/007* (2013.01); *F21W 2107/30* (2018.01); *F21Y 2113/00* (2013.01); *F21Y 2115/10* (2016.08)

(58) Field of Classification Search
CPC ............ B81B 3/0024; B81B 2201/036; F21V 29/508; F21W 2107/30; F21Y 2113/00; F21Y 2115/10; H01L 23/467
See application file for complete search history.

(56) References Cited

U.S. PATENT DOCUMENTS

| | | |
|---|---|---|
| 9,250,261 B2 | 2/2016 | Lin et al. |
| 9,815,689 B2 | 11/2017 | Lin et al. |
| 10,320,312 B2 | 6/2019 | Banduric |

(Continued)

*Primary Examiner* — Jason M Han
(74) *Attorney, Agent, or Firm* — Lorenz & Kopf LLP

(57) ABSTRACT

A device includes a processor or integrated circuit package and at least one MEMS device coupled to the processor or integrated circuit package. The at least one MEMS device includes a first arm, a second arm, at least one permanent magnet, a fan structure, and a coil. The second arm is coupled to, and is spaced apart from, the first arm. The at least one permanent magnet is coupled to the first arm. The fan structure is coupled to, and extends in cantilever manner from, the second arm. The coil is disposed on or within the fan. Thus, when the coil is electrically energized, a Lorentz force is generated that causes the fan structure to vibrate relative to the at least one permanent magnet and relative to the processor, to thereby cool the processor or integrated circuit package.

14 Claims, 3 Drawing Sheets

(56) References Cited

U.S. PATENT DOCUMENTS

| | | |
|---|---|---|
| 2007/0209437 A1 | 9/2007 | Xue et al. |
| 2017/0292537 A1 | 10/2017 | Barak |
| 2022/0087058 A1 | 3/2022 | Sankar et al. |
| 2023/0011084 A1 | 1/2023 | Mukundan et al. |

PROCESSORS AND INTEGRATED CIRCUITS INCLUDING A MICROELECTROMECHANICAL SYSTEMS (MEMS) DEVICE FOR COOLING

CROSS REFERENCE TO RELATED APPLICATION

The present application is a continuation-in-part of U.S. patent application Ser. No. 18/457,562, filed Aug. 29, 2023, which claims benefit of prior filed India Provisional Patent Application No. 202311048028, filed Jul. 17, 2023, and which is hereby incorporated by reference herein in its entirety.

TECHNICAL FIELD

The present disclosure relates to processors and integrated circuit packages and more particularly to processors and integrated circuit packages that include a microelectromechanical systems (MEMS) device for cooling the processors and integrated circuit packages.

BACKGROUND

Many relatively high-power light systems, such as aircraft exterior light systems, generate relatively large amounts of heat that needs to be dissipated. Unfortunately, many of these systems, such as high-power light emitting diode (LED) systems, cannot efficiently dissipate the generated heat using standard heat dissipation methods, which typically involves transferring a major portion of heat to a lamp's front lens. As a result, high-power light systems frequently operate at high temperatures.

High-power light systems, such as high-power LED light systems, perform inefficiently at high operating temperatures. Indeed, empirical evidence indicates that high-power LED light systems can last for up to 50,000 hours when operated at room temperature; however, when operated at temperatures near to 90° C., the lifespans can be as low as 7,000 hours. To avoid these deleterious effects, some high-power light systems, such as those used for aircraft exterior lights, are derated by as much as 20% and may include extended surface areas to provide natural cooling, which can result in undesirable weight increases in the range of 20-30%.

Heat has also become one of the biggest bottlenecks in the area of increased computing capacity. The latest processors are configured to provide relatively higher performance. However, in practice, the increased performance is due to thermal limits. Unfortunately, what often determines the actual performance of modern processors is the capability of the thermal solution, not the sophistication of the processor.

Hence, there is a need for a technique to provide sufficient cooling for high-power light systems, such as high-power aircraft exterior light systems, and for processors (and other integrated circuits), that does not significantly increase weight and/or does not require derating of the light systems or the processors/integrated circuits. The current disclosure addresses at least these needs.

BRIEF SUMMARY

This summary is provided to describe select concepts in a simplified form that are further described in the Detailed Description. This summary is not intended to identify key or essential features of the claimed subject matter, nor is it intended to be used as an aid in determining the scope of the claimed subject matter.

In one embodiment, a processing device includes a processor and at least one microelectromechanical systems (MEMS) device coupled to the processor. The at least one MEMS device includes a first arm, a second arm, at least one permanent magnet, a fan structure, and a coil. The first arm has a first arm first end and a first arm second end. The second arm is coupled to, and is spaced apart from, the first arm and has a second arm first end and a second arm second end. The at least one permanent magnet is coupled to the first arm second end. The fan structure is coupled to, and extends in cantilever manner from, the second arm second end. The fan structure includes a connection end and a free end. The connection end is coupled to the second arm second end, and the free end is spaced apart from the at least one permanent magnet. The coil is disposed on or within the fan structure at a location that is at least adjacent the free end. Thus, when the coil is electrically energized, a Lorentz force is generated that causes the fan structure to vibrate relative to the at least one permanent magnet and relative to the processor, to thereby cool the processor.

In another embodiment includes an integrated circuit package and at least one microelectromechanical systems (MEMS) device coupled to the integrated circuit package. The at least one MEMS device includes a first arm, a second arm, at least one permanent magnet, a fan structure, and a coil. The first arm has a first arm first end and a first arm second end. The second arm is coupled to, and is spaced apart from, the first arm and has a second arm first end and a second arm second end. The at least one permanent magnet is coupled to the first arm second end. The fan structure is coupled to, and extends in cantilever manner from, the second arm second end. The fan structure includes a connection end and a free end. The connection end is coupled to the second arm second end, and the free end is spaced apart from the at least one permanent magnet. The coil is disposed on or within the fan structure at a location that is at least adjacent the free end. Thus, when the coil is electrically energized, a Lorentz force is generated that causes the fan structure to vibrate relative to the at least one permanent magnet and relative to the processor, to thereby cool the integrated circuit package.

Furthermore, other desirable features and characteristics of the microelectromechanical systems (MEMS) device, processor, and integrated circuit package will become apparent from the subsequent detailed description and the appended claims, taken in conjunction with the accompanying drawings and the preceding background.

BRIEF DESCRIPTION OF DRAWINGS

The present disclosure will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. As used herein, the word "exemplary" means "serving as an example, instance, or illustration." Thus, any embodiment described herein as "exemplary" is not necessarily to be construed as preferred or advantageous over other embodiments. All of the embodiments described herein are exemplary embodiments provided to enable persons skilled in the art to make or use the invention and not to limit the scope of the invention which is defined by the claims. Furthermore, there is no intention to be bound by any expressed or implied theory presented in the preceding technical field, background, brief summary, or the following detailed description.

Figure 1:
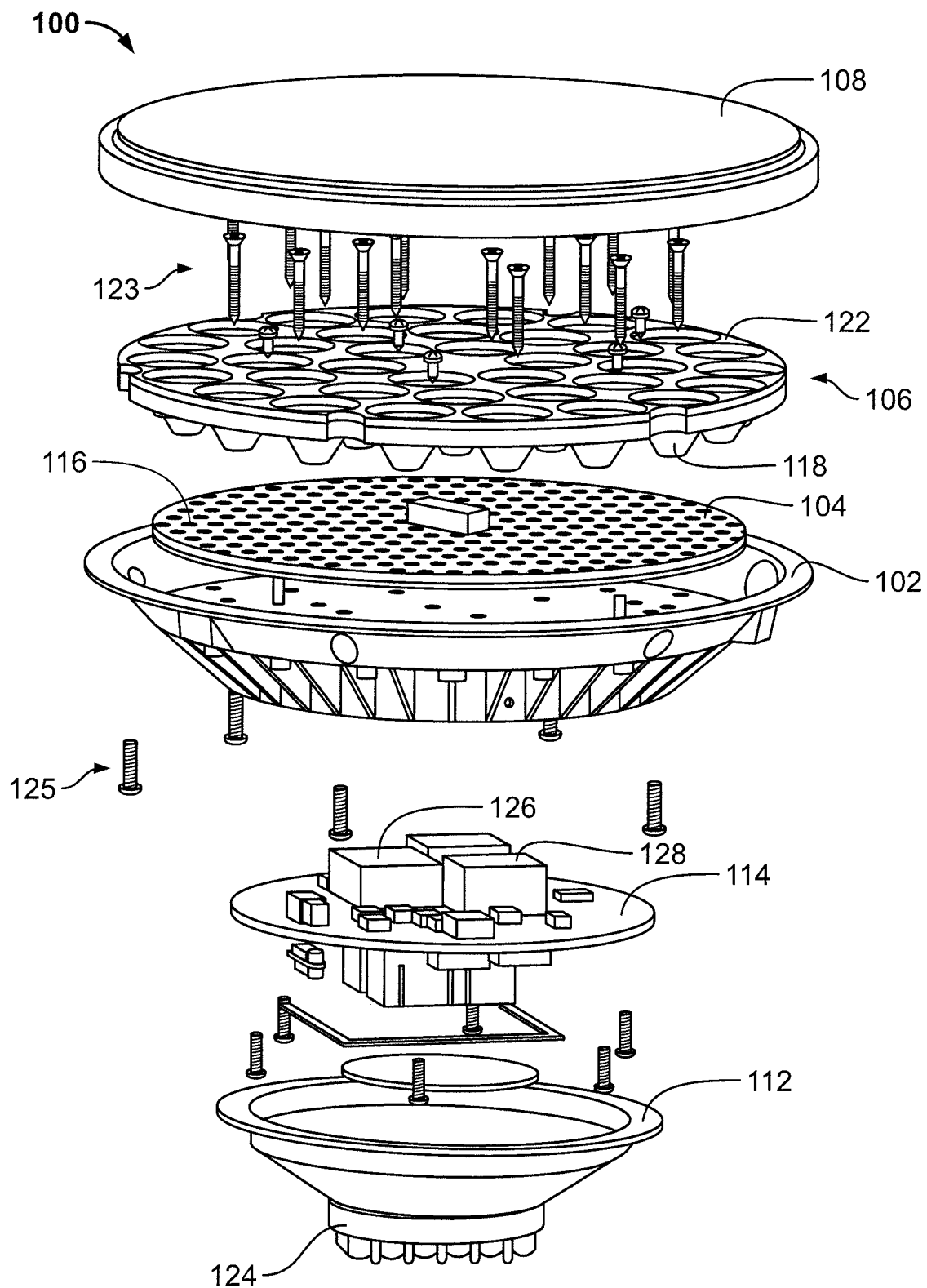
FIG. 1 depicts an exploded view of one embodiment of a light assembly.

Referring to FIG. 1, an exploded view of one embodiment of a light assembly, and more specifically an aircraft exterior light assembly, is depicted. Before proceeding with the description of the light assembly 100, it is noted that the depicted and described light assembly is just one example embodiment of a light assembly, and that various other light assemblies may include one or more features, device, and components further described herein.

With the above in mind, the depicted light assembly 100 includes a housing 102, a light source printed circuit board assembly 104, a lens assembly 106, an outer lens 108, a power supply cover assembly 112, and a power supply printed circuit board 114. The light source printed circuit board assembly 104 is disposed within the housing 102 and has a plurality of light sources 116 mounted thereon. Each of the light sources is 116 operable, upon being electrically energized, to emit light. It will be appreciated that the light sources 116 may be implemented using any one of numerous known light source devices including, for example, incandescent, fluorescent, halogen, metal halide, or filament type devices, just to name a few. In the depicted embodiment, however, each light source 116 is implemented using a light emitting diode (LED).

The lens assembly 106 is also mounted within the housing 102 and is disposed adjacent to the light source printed circuit board assembly 104. The lens assembly 106 includes a plurality of lenses 118 that are, at least in the depicted embodiment, mounted on a lens holder 122. Each of the lenses 118 is associated with a different one of the light sources 116 and is configured to receive and focus the light emitted from its associated light source 116. It will be appreciated that the lenses 118 may be variously configured and implemented. In the depicted embodiment, however, each lens 118 is implemented using a TIR (total internal reflection) lens.

The outer lens 108 is coupled to the housing 102 via suitable hardware 123 and is disposed adjacent to the lens assembly 106. The outer lens 108 thus receives the light that is transmitted through each of the lenses 118 and further focusses and collimates this light. The outer lens 108 may thus be implemented using any one of numerous known collimating lenses.

The power supply cover assembly 112 is coupled to the housing 102 via suitable hardware 125 and, at least in the depicted embodiment, includes a connector 124, which facilitates connecting the light assembly 100 to a suitable power source (not illustrated). The power supply cover assembly 112 also has the power supply printed circuit board assembly 114 disposed therein. A power supply 126 is mounted on the power supply printed circuit board assembly 114 and is electrically coupled to, and is configured to electrically energize, the light sources 116.

Figure 2:
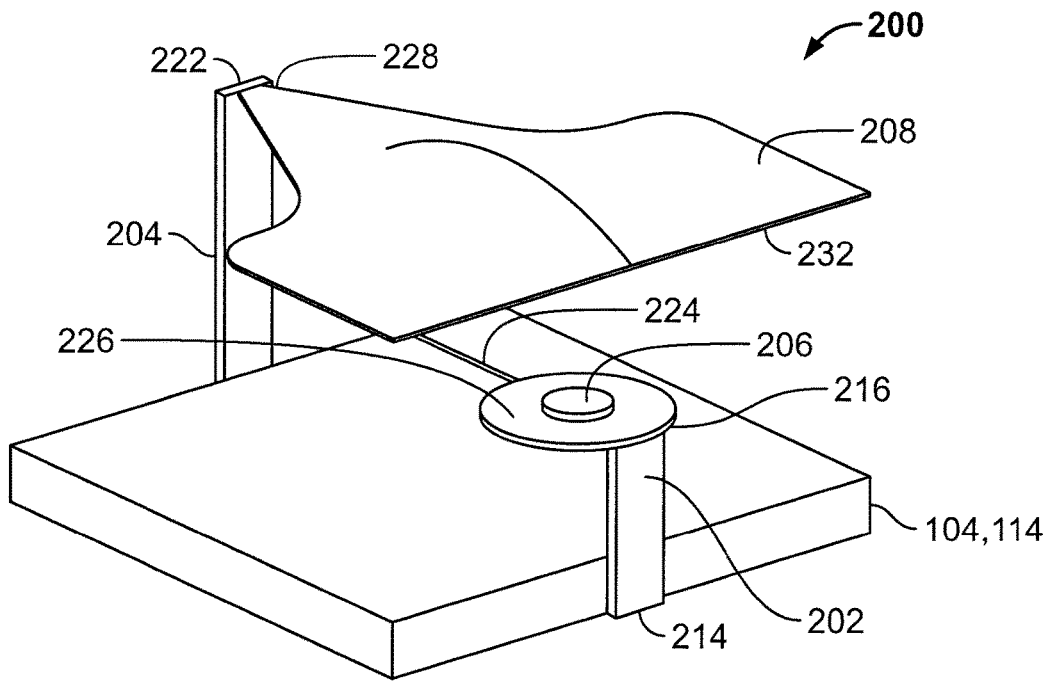
FIG. 2 depicts a plan view of a microelectromechanical systems (MEMS) device that may be included in the light assembly of FIG. 1 and coupled to a surface to be cooled.

Although not visible in FIG. 1, the light assembly 100 additionally includes at least one microelectromechanical systems (MEMS) device, and preferably more than one MEMS device. Specifically, at least one MEMS device is coupled to the light source printed circuit board assembly 104 and, in some embodiments, one or more additional MEMS devices may be coupled to the power supply printed circuit board assembly 114. An embodiment of the MEMS device(s) included in the light assembly 100 are depicted in FIGS. 2 and 3, and with reference thereto will now be described.

Figure 3:
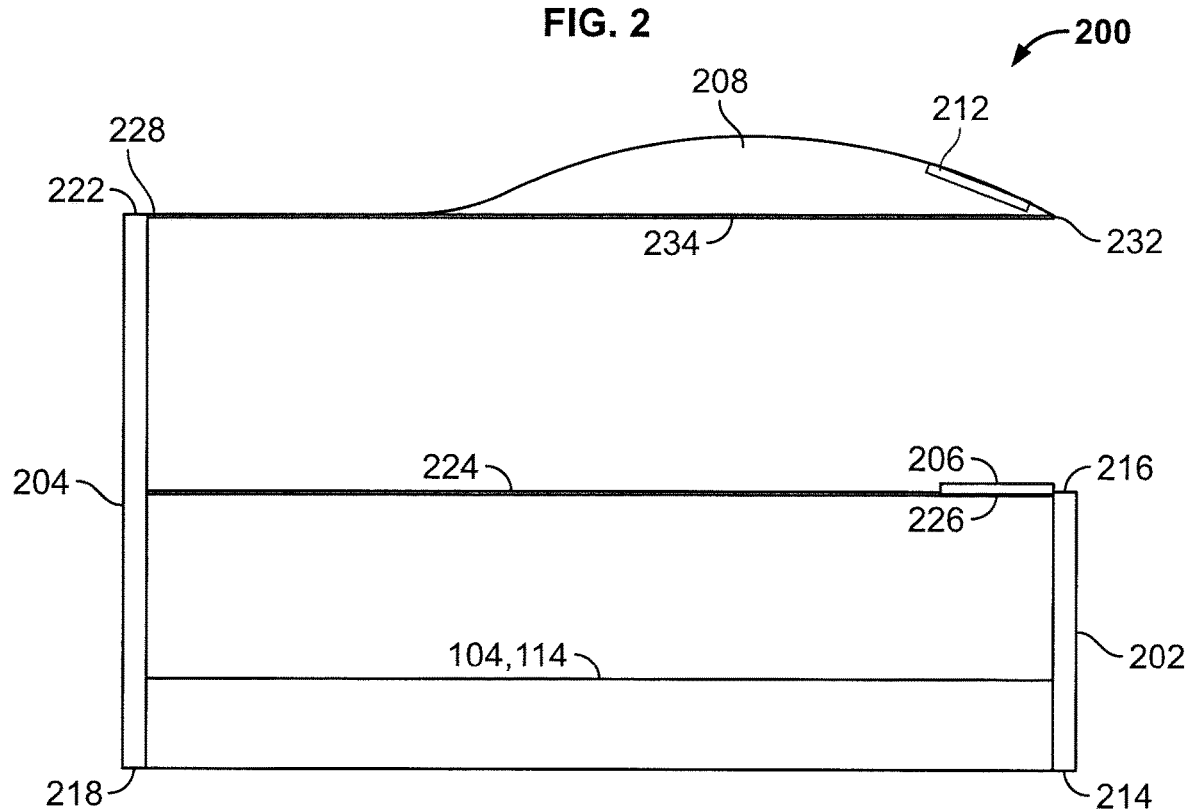
FIG. 3 depicts a cross sectional view of the MEMS device of FIG. 2.

The depicted MEMS device 200 includes a first arm 202, a second arm 204, at least one permanent magnet 206, a fan structure 208, and a coil 212 (see FIG. 3). The first arm 202 includes a first arm first end 214 and a first arm second end 216. The second arm 204 is coupled to, and is spaced apart from, the first arm 202, and includes a second arm first end 218 and a second arm second end 222. Although the configuration may vary, in the depicted embodiment, the first arm 202 and second arm 204 are coupled together via a web structure 224. Moreover, the first arm 202 and the second arm 208 are each configured to engage a surface of a device such as, for example, the light source printed circuit board assembly 104 and/or the power supply printed circuit board assembly 114.

The at least one permanent magnet 206 is coupled to the first arm second end 216. More specifically, at least in the depicted embodiment, the at least one permanent magnet 206 is disposed on a magnet holder 226 that is disposed on, or is formed as part of, the web structure 224. The at least one permanent magnet 206 may be implemented using a single permanent magnet or it may include a plurality of permanent magnets. When implemented using a plurality of magnets, the plurality of permanent magnets preferably includes both axially magnetized permanent magnets and radially magnetized permanent magnets.

The fan structure 208 is coupled to, and extends in cantilever manner from, the second arm second end 222. The fan structure 208 includes a connection end 228, which is coupled to the second arm second end 222, and a free end 232, which is spaced apart from the at least one permanent magnet 206. As shown most clearly in FIG. 3, the fan structure 208 has a surface area that varies between the connection end 228 and the free end 232, and it additionally has a concave inner surface 234 that faces the web structure 224.

The coil 212 is disposed on, or preferably within, the fan structure 208. Preferably, the coil 212, whether on or within the fan structure, is disposed at a location that is at least adjacent the free end 232 so that it is spaced apart from the at least one permanent magnet 206. With this configuration, when the coil 212 is electrically energized, a Lorentz force is generated that causes the fan structure 208 to vibrate relative to the at least one permanent magnet 206 and relative to the device (e.g., the light source printed circuit board assembly 104 and/or the power supply printed circuit board assembly 1140, to thereby cool the device (e.g., the light source printed circuit board assembly 104 and/or the power supply printed circuit board assembly 114.

To facilitate the functionality of the MEMS device(s) 200, a control circuit is also preferably included. In the context of the light assembly depicted in FIG. 1, the control circuit 128 is electrically mounted on the power supply printed circuit board assembly 128 and is coupled to, and is configured to electrically energize, the coil 212 with an electric current. Preferably, the control circuit 128 is configured to electrically energize the coil 212 with a modulated electric current, and most preferably is configured to electrically energize the coil with an electric current that is modulated at a frequency that matches the natural frequency of the fan structure 208.

Figure 4:
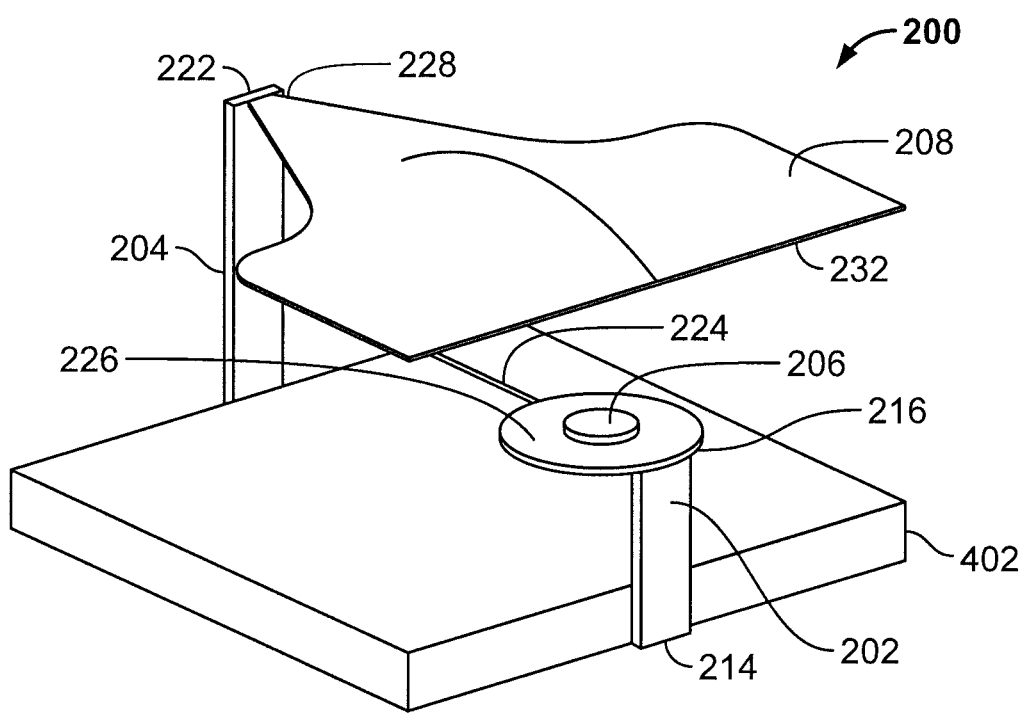
FIG. 4 depicts a plan view of the MEMS device coupled to a processor.

Turning now to FIG. 4, the MEMS device 200 is shown coupled to a processor 402. More specifically, the first arm 202 and the second arm 208 each engage a surface of the processor 402. Before proceeding further, it is noted that although the device in FIG. 4 is specifically described as being a processor, it will be appreciated that the device may be anyone of numerous other types of integrated circuit packages.

Returning to the description, and as previously described, when the coil 212 is electrically energized, a Lorentz force is generated that causes the fan structure 208 to vibrate relative to the at least one permanent magnet 206 and relative to the processor 402 (or integrated circuit package), to thereby cool the processor 402 (or integrated circuit package).

The MEMS device disclose herein provides sufficient cooling for high-power light systems, such as high-power aircraft exterior light systems, and provides significant benefits and advantages. For example, it provides relatively long life for the lights, resulting in lower operating costs for end users, it allows the lights to be operated closer to rated values, increasing the range of visibility, the construction is relatively simple and exhibits no cogging, it provides precise, fast, and highly efficient cooling, it can be designed as plug-and-play component, it exhibits minimal weight penalty, and the negligible inertia of the MEMS device will exhibit little, if any, wear and tear.

The MEMS device disclose herein also provides sufficient cooling for processors and various other integrated circuit package devices.

In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language. The sequence of the text in any of the claims does not imply that process steps must be performed in a temporal or logical order according to such sequence unless it is specifically defined by the language of the claim. The process steps may be interchanged in any order without departing from the scope of the invention as long as such an interchange does not contradict the claim language and is not logically nonsensical.

Furthermore, depending on the context, words such as "connect" or "coupled to" used in describing a relationship between different elements do not imply that a direct physical connection must be made between these elements. For example, two elements may be connected to each other physically, electronically, logically, or in any other manner, through one or more additional elements.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A processing device, comprising:
   a processor; and
   at least one microelectromechanical systems (MEMS) device coupled to the processor, the at least one MEMS device comprising:
   a first arm having a first arm first end and a first arm second end;
   a second arm coupled to, and spaced apart from, the first arm, the second arm having a second arm first end and a second arm second end;
   at least one permanent magnet coupled to the first arm second end;
   a fan structure coupled to, and extending in cantilever manner from, the second arm second end, the fan structure comprising a connection end and a free end, the connection end coupled to the second arm second end, the free end spaced apart from the at least one permanent magnet; and
   a coil disposed on or within the fan structure at a location that is at least adjacent the free end,
   wherein, when the coil is electrically energized, a Lorentz force is generated that causes the fan structure to vibrate relative to the at least one permanent magnet and relative to the processor, to thereby cool the processor.

2. The processing device of claim 1, wherein the MEMS device further comprises:
   a web structure coupled to the first arm and the second arm,
   wherein the at least one permanent magnet is disposed on the web structure.

3. The processing device of claim 1, wherein the fan structure has (i) a surface area that varies between the connection end and the free end and (ii) a concave inner surface.

4. The processing device of claim 1, wherein:
   the at least one permanent magnet comprises a plurality of permanent magnets; and
   the plurality of permanent magnets includes axially magnetized permanent magnets and radially magnetized permanent magnets.

5. The processing device of claim 1, wherein the MEMS device further comprises:
   a control circuit electrically coupled to, and configured to electrically energize, the coil.

6. The processing device of claim 5, wherein the control circuit is configured to electrically energize the coil with a modulated electric current.

7. The processing device of claim 6, wherein:
   the fan structure exhibits a natural frequency; and
   the control circuit is configured to modulate the electric current at a frequency that matches the natural frequency of the fan structure.

8. A device, comprising:
   an integrated circuit package; and
   at least one microelectromechanical systems (MEMS) device coupled to the integrated circuit package, the at least one MEMS device comprising:
   a first arm having a first arm first end and a first arm second end;
   a second arm coupled to, and spaced apart from, the first arm, the second arm having a second arm first end and a second arm second end;
   at least one permanent magnet coupled to the first arm second end;
   a fan structure coupled to, and extending in cantilever manner from, the second arm second end, the fan structure comprising a connection end and a free end, the connection end coupled to the second arm second end, the free end spaced apart from the at least one permanent magnet; and a coil disposed on or within the fan structure at a location that is at least adjacent the free end, wherein, when the coil is electrically energized, a Lorentz force is generated that causes the fan structure to vibrate relative to the at least one permanent magnet and relative to the processor, to thereby cool the integrated circuit package.

9. The device of claim 8, wherein the MEMS device further comprises:

a web structure coupled to the first arm and the second arm, wherein the at least one permanent magnet is disposed on the web structure.

10. The device of claim 8, wherein the fan structure has (i) a surface area that varies between the connection end and the free end and (ii) a concave inner surface.

11. The device of claim 8, wherein:

the at least one permanent magnet comprises a plurality of permanent magnets; and the plurality of permanent magnets includes axially magnetized permanent magnets and radially magnetized permanent magnets.

12. The device of claim 8, wherein the MEMS device further comprises:

a control circuit electrically coupled to, and configured to electrically energize, the coil.

13. The device of claim 12, wherein the control circuit is configured to electrically energize the coil with a modulated electric current.

14. The device of claim 13, wherein:

the fan structure exhibits a natural frequency; and the control circuit is configured to modulate the electric current at a frequency that matches the natural frequency of the fan structure.

* * * * *